United States Patent
Nogami

(10) Patent No.: US 11,527,629 B2
(45) Date of Patent: Dec. 13, 2022

(54) FIELD EFFECT TRANSISTOR

(71) Applicant: Mitsubishi Electric Corporation, Tokyo (JP)

(72) Inventor: Yoichi Nogami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 211 days.

(21) Appl. No.: 16/967,726

(22) PCT Filed: Apr. 13, 2018

(86) PCT No.: PCT/JP2018/015522
§ 371 (c)(1),
(2) Date: Aug. 5, 2020

(87) PCT Pub. No.: WO2019/198226
PCT Pub. Date: Oct. 17, 2019

(65) Prior Publication Data
US 2021/0043743 A1    Feb. 11, 2021

(51) Int. Cl.
*H01L 29/423*    (2006.01)
*H01L 23/31*    (2006.01)
(Continued)

(52) U.S. Cl.
CPC .... *H01L 29/42316* (2013.01); *H01L 23/3171* (2013.01); *H01L 29/7787* (2013.01);
(Continued)

(58) Field of Classification Search
CPC .......... H01L 29/7786; H01L 29/42316; H01L 23/3171; H01L 29/7787
See application file for complete search history.

(56) References Cited

U.S. PATENT DOCUMENTS 6,316,820 B1 * 11/2001 Schmitz .............. H01L 23/3171
257/649
7,592,211 B2 * 9/2009 Sheppard ............ H01L 29/7787
257/E21.403
(Continued)

FOREIGN PATENT DOCUMENTS

JP    2004253620 A    9/2004
JP    2006120694 A    5/2006
(Continued)

OTHER PUBLICATIONS

M. G. Ancona, S. C. Binari and D. J. Meyer, "Fully coupled thermoelectromechanical analysis of GaN high electron mobility transistor degradation", Apr. 5, 2012, Journal of Applied Physics, 111, pp. 074504-1-074504-16. (Year: 2012).*

(Continued)

*Primary Examiner* — Changhyun Yi
(74) *Attorney, Agent, or Firm* — Studebaker & Brackett PC

(57) ABSTRACT

A field-effect transistor includes a gate electrode formed on an electron supply layer thereon, a source electrode and a drain electrode thereon; and also the field-effect transistor includes an insulation film for covering the electron supply layer, and an opening portion of the insulation film, having trapezoidal prism's oblique contour faces, being provided in a region to form the gate electrode in the insulation film. It is so arranged that the gate electrode is made to have a Schottky junction with respect to a region where the electron supply layer is exposed through the opening portion, and also that the trapezoidal prism's oblique contour faces each formed by the opening portion have inclination angles in a range from 25 degrees to 75 degrees with respect to a surface of the electron supply layer.

16 Claims, 8 Drawing Sheets

(51) Int. Cl.
- *H01L 29/778* (2006.01)
- *H01L 23/29* (2006.01)
- *H01L 29/20* (2006.01)
- *H01L 29/205* (2006.01)

(52) U.S. Cl.
CPC ........ *H01L 23/291* (2013.01); *H01L 29/2003* (2013.01); *H01L 29/205* (2013.01)

(56) References Cited

U.S. PATENT DOCUMENTS

| | | |
|---|---|---|
| 2004/0164374 A1 | 8/2004 | Ishikura |
| 2007/0164321 A1 | 7/2007 | Sheppard et al. |
| 2007/0164322 A1 | 7/2007 | Smith et al. |
| 2008/0290372 A1* | 11/2008 | Makiyama .......... H01L 29/7787 257/E21.403 |
| 2009/0224289 A1 | 9/2009 | Sheppard et al. |
| 2010/0171150 A1 | 7/2010 | Smith et al. |
| 2016/0079405 A1 | 3/2016 | Saki |

FOREIGN PATENT DOCUMENTS

| | | |
|---|---|---|
| JP | 2008244001 A | 10/2008 |
| JP | 2009524242 A | 6/2009 |
| JP | 2014138167 A | 7/2014 |
| JP | 2016058682 A | 4/2016 |
| WO | 2007/084465 A1 | 7/2007 |

OTHER PUBLICATIONS

International Search Report issued in PCT/JP2018/015522; dated Jun. 19, 2018.

Mattalah. M. et al.; "Analysis of the SiO2/Si3N4 passivation bilayer thickness on the rectifier behavior of AlGaN/GaN HEMTs on (111) silicon substrate"; Phys. Status Solidi C9; No. 3-4; 2012; pp. 1083-1087.

An Office Action issued by the German Patent Office dated Jan. 12, 2022, which corresponds to German Patent Application No. 11 2018 007 473.0 and is related to U.S. Appl. No. 16/967,726 with English language translation.

* cited by examiner

FIELD EFFECT TRANSISTOR

TECHNICAL FIELD

The present disclosure relates to a field-effect transistor, and in particular to a high-electron-mobility transistor produced utilizing a nitride semiconductor(s).

BACKGROUND ART

In recent years, as representative of AlGaN/GaN high-electron-mobility transistors (abbreviated as a "HEMT": High Electron Mobility Transistor; hereinafter, referred to as a "HEMT"), the production and practical use of field-effect transistors utilizing a nitride semiconductor(s) focusing on GaN-based HEMTs are proceeded; their applications to amplifiers subjected to mobile telephone base-stations are representative, so that it is expected to see, also from this time forward, the proliferation and expansion toward market fields related to high-frequency communication devices.

As for a GaN-based HEMT described above, it is difficult to control its gate leakage current; for this reason, there arises a case in which the leakage current becomes large so that the quality cannot be maintained, and thus, a GaN-based HEMT having a much stabler and smaller gate leakage current is required.

The reason may be attributed to that, in a GaN-based HEMT, there have already been reported in a significant number on exemplary cases in which a gate leakage current varies to a large extent by receiving an influence of a wet process (es) or a dry process (es) at a wafer process step, or on exemplary cases in which a gate leakage current varies to a large extent by receiving an influence of an insulation film for protecting a semiconductor epitaxial layer's surface; because of this, a large factor resides in that the semiconductor epitaxial layer's surface is sensitive.

Conventionally, it is so stated that, according to compressive stress in which silicon oxides formed on an electron supply layer have, a field-effect transistor of nitride semiconductors having a small gate leakage current can be obtained (for example, refer to Patent Document 1).

In addition, conventionally, it is so stated that, in a structure of a gate electrode which is formed so as to cover the inside at an opening portion of an insulation film formed upon a semiconductor operation layer, and to cover to ride upon the insulation film, side faces of the opening portion are made in shapes to tilt in a tapered type (top-face sides of an opening portion of the insulation film are each in a shape to incline on a drain side), whereby a withstand voltage can be enhanced due to an effect to mitigate electric field concentration in opening end portions of the gate electrode (namely, a gate leakage current becomes smaller), (for example, refer to Patent Document 2).

RELATED ART DOCUMENTS

Patent Documents

[Patent Document 1] Japanese Patent Laid-Open No. 2008-244001

[Patent Document 2] Japanese Patent Laid-Open No. 2004-253620

SUMMARY OF THE INVENTION

Problems to be Solved by the Invention

However, as this will be described later, an influence in which residual stresses of insulation films exerts on electrical characteristics of a GaN-based HEMT has been reviewed by simulation; as a result, as for the technology stated in Patent Document 1 described above, it is feared that, on the contrary, a gate leakage current increases, so that it can be understood that there arises a problem in which a sufficient effect cannot be expected. In addition, as for the technology stated in Patent Document 2, it can be understood that, by considering not only a shape (tilt or inclination angle) of an opening portion of a gate electrode, but also residual stresses of an insulation film(s), it can be understood that a gate leakage current can be further reduced.

The present disclosure in the application concerned has been directed at disclosing technologies for resolving those problems as described above, an object of the disclosure is to obtain a field-effect transistor which can reduce its gate leakage current without being dependent on a state(s) of a semiconductor surface, or on an influence(s) of film quality of a dielectric protection film for protecting the surface.

Means for Solving the Problems

A field-effect transistor disclosed in the invention of the application concerned is a field-effect transistor which has a gate electrode formed on a surface of an electron supply layer, a source electrode thereon and a drain electrode thereon, and the field-effect transistor comprises:

an insulation film including a first insulation film, having compressive stress therein, being formed on a surface of the electron supply layer, and a second insulation film, having tensile stress or having compressive stress lower than that of the first insulation film, being formed on top faces of the first insulation film, and the insulation film covering the electron supply layer; and an opening portion of the insulation film having trapezoidal prism's oblique contour faces, being formed in a region to form the gate electrode in the insulation film, which makes contacts on surfaces each thereof with the electron supply layer, wherein the gate electrode is made to have a Schottky junction with the electron supply layer in a region where the electron supply layer is exposed through the opening portion;

the insulation film has contacts with the gate electrode on trapezoidal prism's oblique contour faces each at the opening portion, and on top faces thereat opposing to a surface where the insulation film has contacts with the electron supply layer; and also cross-sectional shapes of trapezoidal prism's oblique contour faces each at the opening portion are made to have inclination angles being set in a range from twenty-five degrees to seventy-five degrees with respect to a surface of the electron supply layer.

Effects of the Invention

According to the field-effect transistor disclosed in the disclosure of the application concerned, a field-effect transistor is obtained in which its gate leakage current can be uniformly reduced, without being influenced by a state(s) of each of layers and/or films constituting of the field-effect transistor, or by film quality of an insulation film(s) thereof for protecting a surface(s).

EMBODIMENTS FOR CARRYING OUT THE INVENTION

Before the explanation will be specifically made for embodiments of the disclosure of the application concerned, the explanation will be first made for the contents taken under the consideration when the structures of field-effect transistors disclosed in the embodiments of the disclosure of the application concerned have been determined. This is because the present consideration contents are important also in view of understanding the configurations of the disclosure of the application concerned.

First, in order to systematically understand an influence in which residual stress of an insulation film(s) exerts on electrical characteristics of a GaN-based HEMT, analyses have been carried out using device simulation.

To be specific, residual stresses of an insulation film formed directly upon a semiconductor surface (or it can be put another way as a surface of an electron supply layer shown in FIG. 1, as this will be described later) are set in ranges of compressive stress (a value of residual stress is at −1 GPa), the absence of residual stress, and tensile stress (a value of residual stress is at +1 GPa); a structure of a gate electrode is used in which, its adoption being in wide use as a structure of a gate electrode portion of a GaN-based HEMT at this point in time, the gate electrode is formed so as to cover the inside at an opening portion of the insulation film, and to cover to ride upon the insulation film; and the calculations have been carried out how gate leakage current values indicate the dependencies each in a case in which a cross-sectional shape of an opening portion is of a rectangle (in a case in which an opening portion of an insulation film has rectangular-parallelepipedic contour faces, and the case in which contour lines of opening portion's cross-section orthogonal with respect to the semiconductor surface are perpendicular to the semiconductor surface), and in a case in which a cross-sectional shape of an opening portion is of a trapezium or trapezoid whose upper base is longer than the lower one (in a case in which an opening portion of an insulation film has trapezoidal prism's oblique contour faces, and the case in which contour lines of opening portion's cross-section orthogonal with respect to the semiconductor surface are tilted with respect to the semiconductor surface) and also the case in which tilt or inclination angles of two straight lines mutually intersecting with a semiconductor surface are both defined at 45 degrees with respect to the semiconductor surface.

Figure 7A:
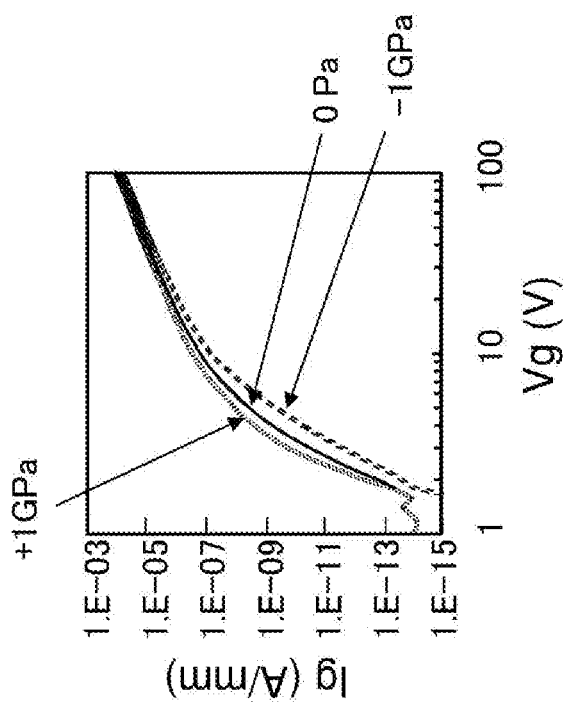
FIGS. 7A and 7B are diagrams each for explaining an influence of an opening portion's shape related to gate leakage current characteristics of field-effect transistors.
Figure 7B:
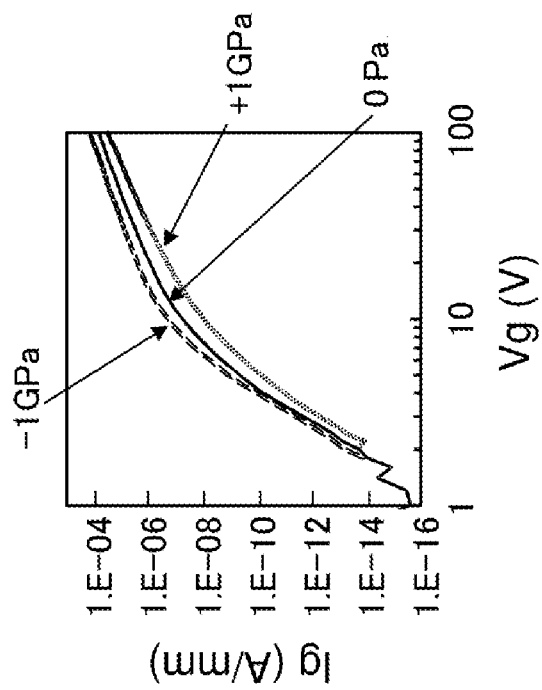

The results are shown in FIGS. 7A and 7B. FIG. 7A shows the results of a case in which an opening portion has rectangular-parallelepipedic contour faces. In this case, a gate leakage current is reduced, when residual stress of an insulation film is of tensile stress (refer to the curve indicated by "+1 GPa" in the figure; hereinafter in a similar fashion); and the gate leakage current is increased, when residual stress of the insulation film is of compressive stress (refer to the curve indicated by "−1 GPa" as a value of the residual stress in the figure; hereinafter in a similar fashion). Note that, the curve indicated by "0 Pa" as a value of residual stress in the figure shows values of the gate leakage current when the residual stress is zero (hereinafter in a similar fashion).

On the other hand, as shown in FIG. 7B, the calculation results are obtained in that: in a case in which an opening portion has trapezoidal prism's oblique contour faces (when inclination angles of contour lines at an opening portion with respect to a semiconductor surface are each at 45 degrees), a gate leakage current is reduced, when residual stress of an insulation film is of compressive stress (−1 GPa); and the gate leakage current is increased, when residual stress thereof is of tensile stress (refer to the curve indicated by "+1 GPa" as a value of the residual stress in the figure; hereinafter in a similar fashion).

Figure 8:
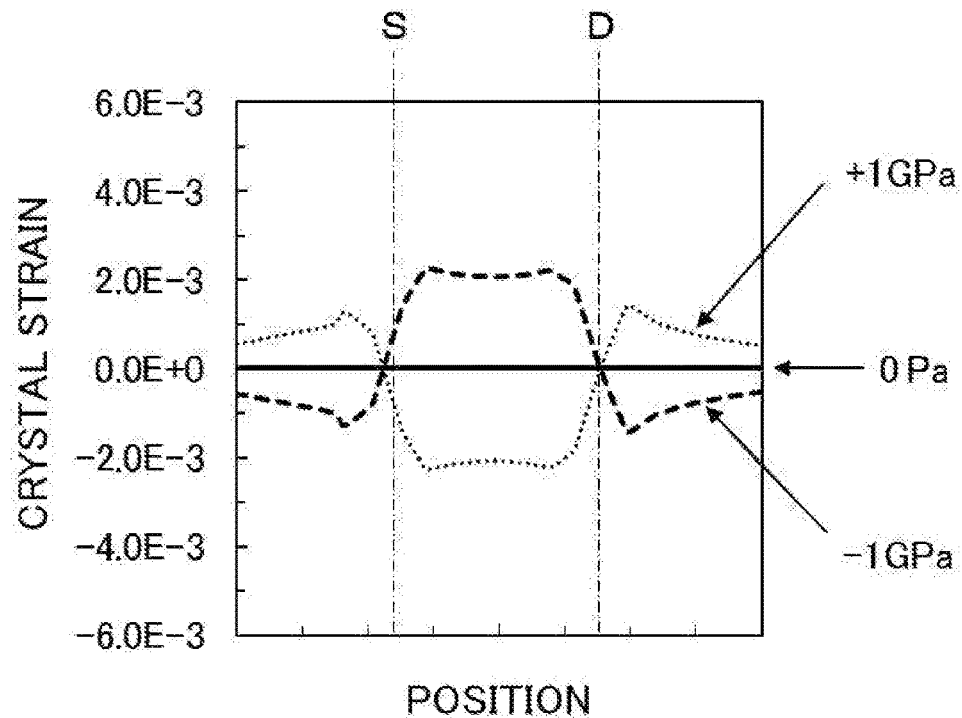
FIG. 8 is a diagram for explaining influences of an opening portion's shape (in a case in which an opening portion has rectangular-parallelepipedic contour faces) related to crystal strain of field-effect transistors.
Figure 9:
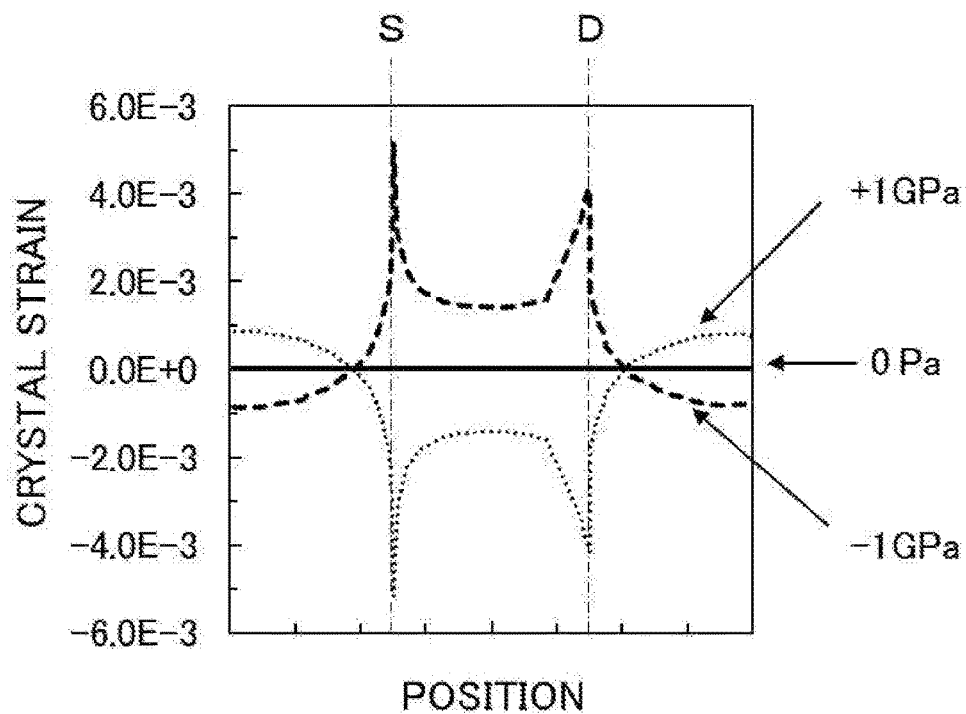
FIG. 9 is a diagram for explaining influences of an opening portion's shape (in a case in which an opening portion has trapezoidal prism's oblique contour faces) related to crystal strain of field-effect transistors.

The explanation will be made for these causes referring from FIG. 8 to FIG. 11. First, FIG. 8 and FIG. 9 show calculation results therefor by means of device simulation, at a position in the depth of 0.5 nm (refer to alternate long and short dashed lines Ps in FIG. 1) from a semiconductor surface (specifically, AlGaN) in a gate electrode region in a direction toward a substrate, for the sake of a Y-Y component of crystal strain (the strain of semiconductor crystal (specifically, AlGaN) in a vertical direction (in upward and downward directions with respect to the sheet) in FIG. 1; as for those symbols each, when the symbol is "plus," indicating an extending direction of crystal, whereas, when the symbol is "minus," indicating a shrinking direction of the crystal). FIG. 8 shows the results in a case in which an opening portion has rectangular-parallelepipedic contour faces. In addition, FIG. 9 shows the results in a case in which an opening portion has trapezoidal prism's oblique contour faces (when inclination angles of contour lines at an opening portion with respect to a semiconductor surface are each at 45 degrees). Note that, in any one of the diagrams FIG. 8 and FIG. 9, alternate long and short dashed lines "S" for use in a positional reference, and alternate long and short dashed lines "D" therefor are concurrently shown as indications. The alternate long and short dashed lines "S" indicates a position of a gate's opening end portion on a source electrode's side; and the alternate long and short dashed lines "D" indicates a position of a gate's opening end portion on a drain electrode's side (as for these alternate long and short dashed lines "S" and alternate long and short dashed lines "D," the same also applies to those in FIG. 10 and FIG. 11 as will be explained below).

From these results, it can be understood that, between a case in which an opening portion for a gate electrode has the rectangular-parallelepipedic contour faces, and a case in which the opening portion therefor has the trapezoidal prism's oblique contour faces (when inclination angles of contour lines at an opening portion with respect to the semiconductor surface are each at 45 degrees), changes in values of Y-Y components of crystal strain depending on their positions are distinctively different from each other at opening end portions of the gate electrode. The places where the symbol "plus" of the crystal strain or "minus" thereof is reversed are positioned at the gate's opening end portions in the former case (in a case in which an opening portion has the rectangular-parallelepipedic contour faces). Meanwhile, it can be understood that, in the latter case (in a case in which an opening portion has the trapezoidal prism's oblique contour faces), those places are positioned close to the source electrode and to the drain electrode, namely positioned on the semiconductor surface, rather than in the gate's opening end portions. In the latter case, it is estimated that, in ordinary cases in the gate's opening end portions where largest electric field is applied thereto, a component of crystal strain shows the tendency to increase, and namely that an influence of residual stress in an insulation film has the tendency to receive with ease.

Figure 10A:
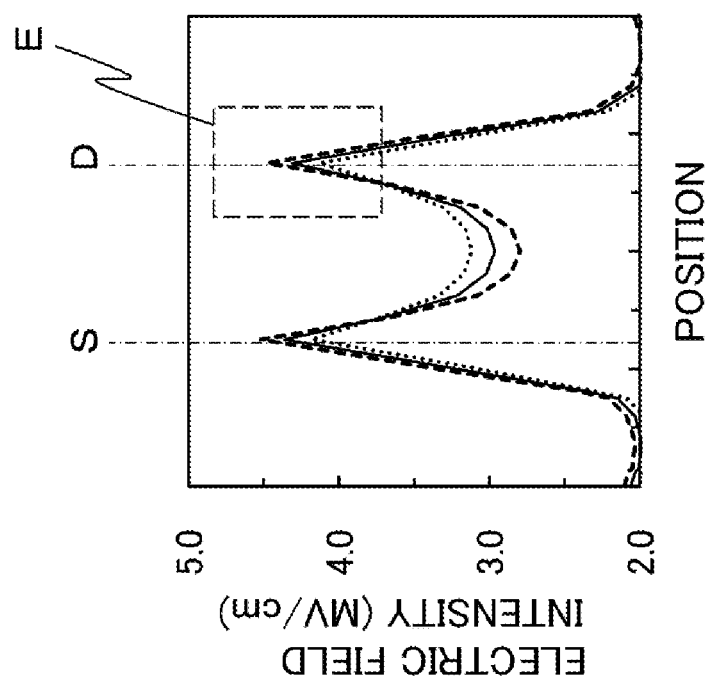
FIGS. 10A and 10B are diagrams each for explaining influences of an opening portion's shape (in a case in which an opening portion has rectangular-parallelepipedic contour faces) related to electric field intensity of a field-effect transistor.
Figure 10B:
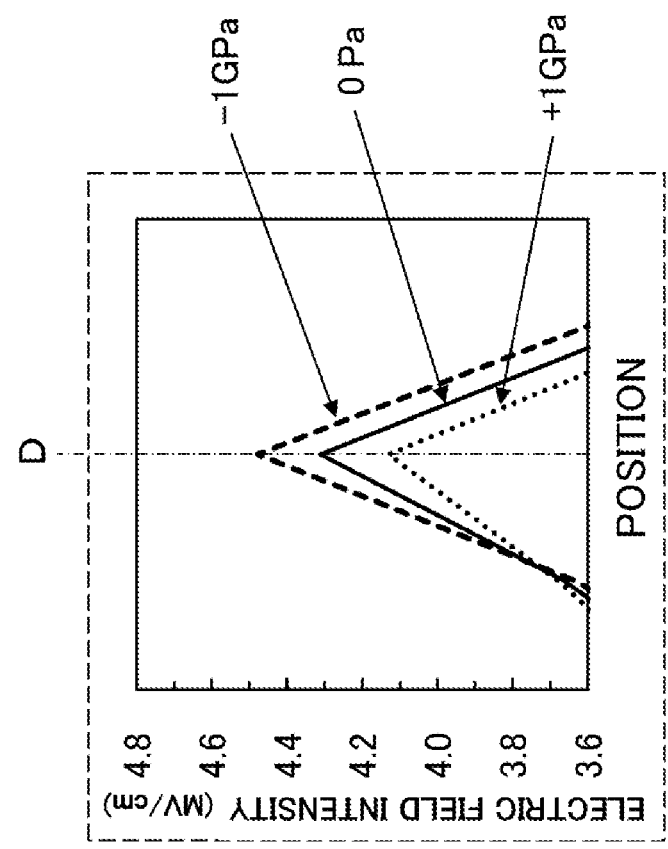
Figure 11B:
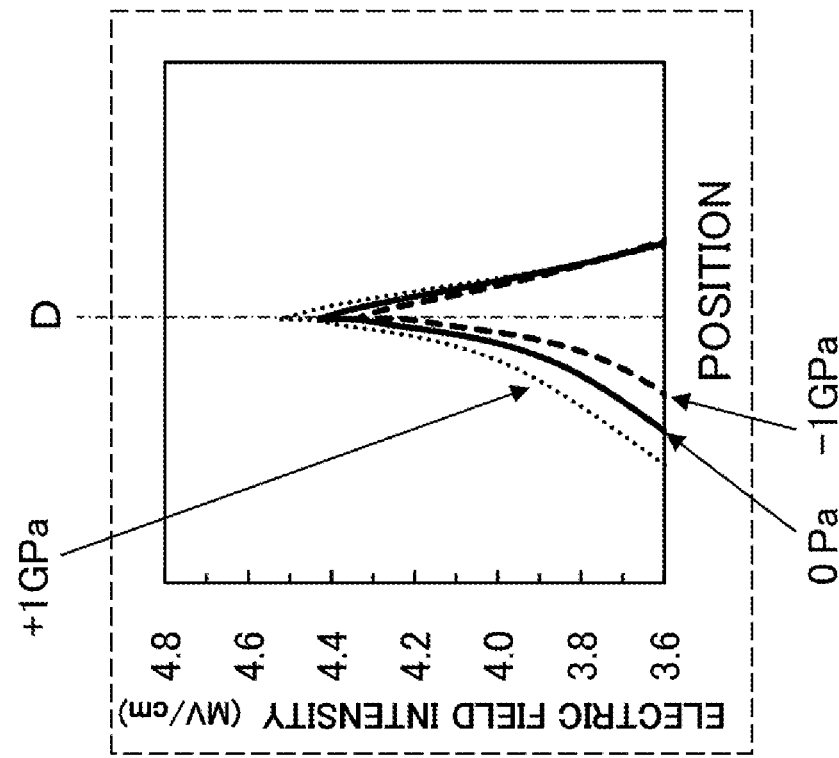
FIGS. 11A and 11B are diagrams each for explaining influences of an opening portion's shape (in a case in which an opening portion has trapezoidal prism's oblique contour faces) related to electric field intensity of a field-effect transistor.
Figure 11A:
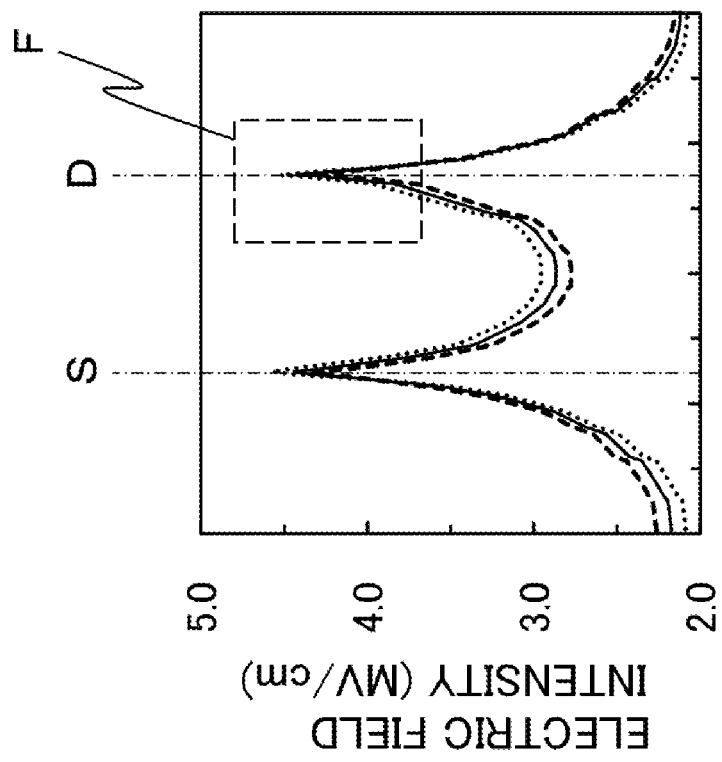

For dealing therewith, next, the electric field intensity near opening end portions of the gate electrode is acquired by calculations by means of device simulation. Those results are shown in FIGS. 10A and 10B, and FIGS. 11A and 11B. FIGS. 10A and 10B show the electric field intensity near opening end portions in a case in which an opening portion has rectangular-parallelepipedic contour faces. In FIGS. 10A and 10B, FIG. 10B is an enlarged view of a part surrounded by the broken line as indicated by symbol "E" of FIG. 10A. In addition, FIGS. 11A and 11B show the electric field intensity near opening end portions in a case in which an opening portion has trapezoidal prism's oblique contour faces (when inclination angles of contour lines at the opening portion with respect to a semiconductor surface are each at 45 degrees). In FIGS. 11A and 11B, FIG. 11B is an enlarged view of a part surrounded by the broken line as indicated by symbol "F" of FIG. 11A.

As shown in FIGS. 10A and 10B, changes in components of crystal strain near the opening end portions of the gate electrode influence on the electric field intensity; and, as for the electric field intensity near the opening end portions of the gate electrode in a case in which the opening portion has the rectangular-parallelepipedic contour faces, the electric field intensity near the opening end portions of the gate electrode is relatively lower, when residual stress of an insulation film is of tensile stress (+1 GPa), whereas the electric field intensity increases when the residual stress thereof is of compressive stress (−1 GPa).

On the other hand, in a case in which the opening portion has the trapezoidal prism's oblique contour faces (when inclination angles of contour lines at an opening portion with respect to the semiconductor surface are each at 45 degrees) as shown in FIGS. 11A and 11B, on the contrary to the results of FIGS. 10A and 10B, the electric field intensity near the opening end portions of the gate electrode is relatively lower, when residual stress of an insulation film is of compressive stress (−1 GPa), whereas the electric field intensity increases when the residual stress thereof is of tensile stress (+1 GPa).

Hereinbefore, it has been newly made clear by means of a sequence of simulation that, depending on residual stress of an insulation film and a shape (inclination angle) of an opening portion for a gate electrode, the electric field intensity at the opening end portions of the gate electrode receives an influence, so that a gate leakage current increases or decreases.

Figure 12:
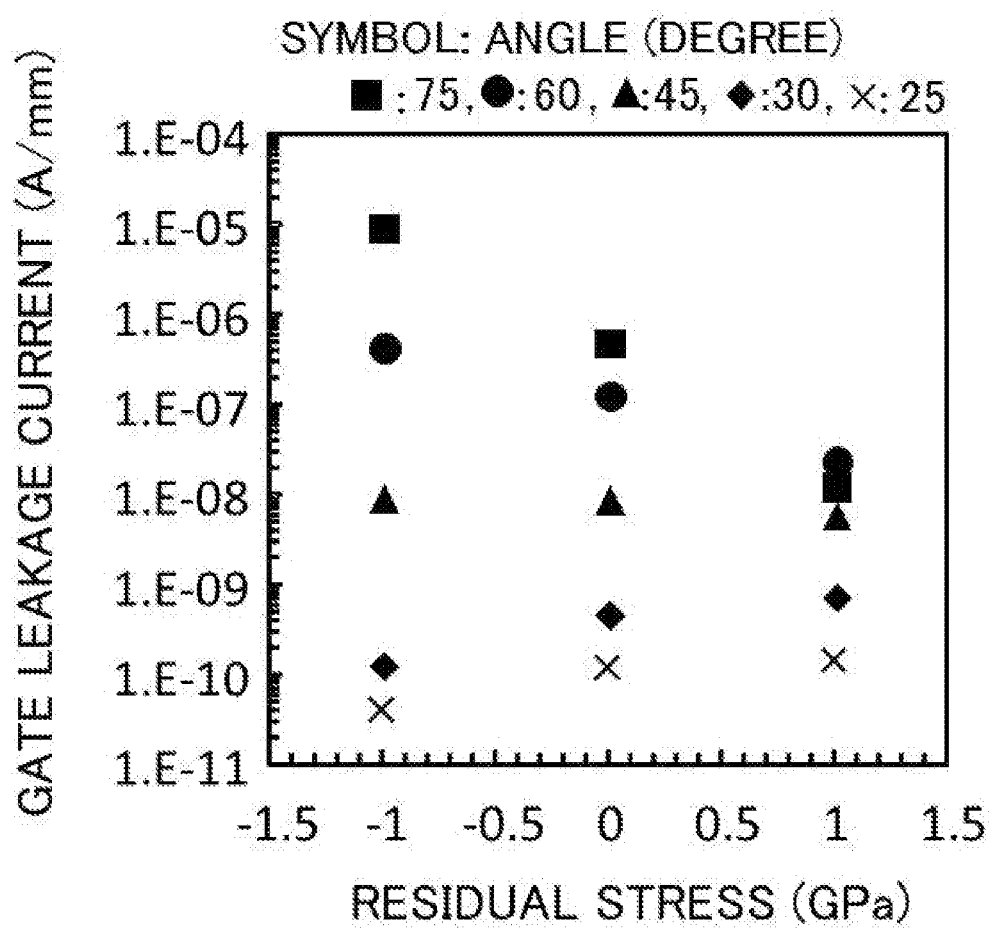
FIG. 12 is a diagram for explaining influences of residual stress in insulation films related to gate leakage current characteristics of field-effect transistors.

For dealing therewith, an influence in which residual stress of the insulation film formed directly upon a semiconductor surface exerts on a gate leakage current has been reviewed by means of simulation. Those results are shown in FIG. 12. As for residual stresses which are shown as in FIG. 12 (along its horizontal axis), a gate leakage current has been calculated in each of the cases of compressive stress (−1 GPa), the absence of residual stress, and tensile stress (+1 GPa), by defining an inclination angle of an opening portion for a gate electrode in its cross-sectional view as a parameter, when the inclination angle is changed in a range from 25 degrees to 75 degrees by defining a semiconductor surface as a reference.

According to those results, it can be understood that, on the threshold of an angular parameter of inclination angle being at approximately 45 degrees as exactly shown in FIG. 12, a gate leakage current of an insulation film having compressive stress (−1 GPa) gets smaller at the time of 45 degrees or less, and that, on the contrary, a gate leakage current of an insulation film having tensile stress (+1 GPa) gets smaller at 45 degrees or more.

The results described above suggest that, by optimally designing residual stress of an insulation film(s) and a shape (inclination angle) of its opening portion for a gate electrode, a GaN-based HEMT having a smaller gate leakage current (s) can be made available.

To be grounded on the basis described above, next, the explanation will be specifically made referring to the drawings for the embodiments of the disclosure of the application concerned.

Embodiment 1

Hereinafter, the explanation will be made on the basis of FIG. 1 for a field-effect transistor according to Embodiment 1. In FIG. 1, as a semiconductor substrate 101 used for a GaN-based HEMT, an SiC substrate, a GaN substrate, an Si substrate, a sapphire substrate, or the like can be mainly named. Upon the semiconductor substrate 101, a channel layer 102 having been grown is formed, and, as a channel layer used for a GaN-based HEMT, a GaN layer is representative. Upon the channel layer 102, an electron supply layer 103 having been grown is formed, and, as an electron supply layer used for a GaN-based HEMT, an AlGaN layer is representative. By adjusting Al composition and a film thickness, a sheet carrier concentration Ns in a range of $2 \times 10^{12}/m^2$ to $4 \times 10^{13}/cm^2$ is obtained which is suitable for target capability of the product(s). Note that, upon the AlGaN layer, there is a case in which a layer called a GaN cap layer for stabilizing a semiconductor surface is formed.

In addition, upon the semiconductor surface, a source electrode 104 making an ohmic contact therewith, and a drain electrode 105 making an ohmic contact therewith are formed. Moreover, upon the semiconductor surface, an insulation film 106 for directly covering the semiconductor surface is formed. The insulation film 106 is featured in that the insulation film has compressive stress therein; in a GaN-based HEMT, an SiN film (the same as a silicon nitride film; hereinafter in a similar fashion) is widely used.

Figure 1:
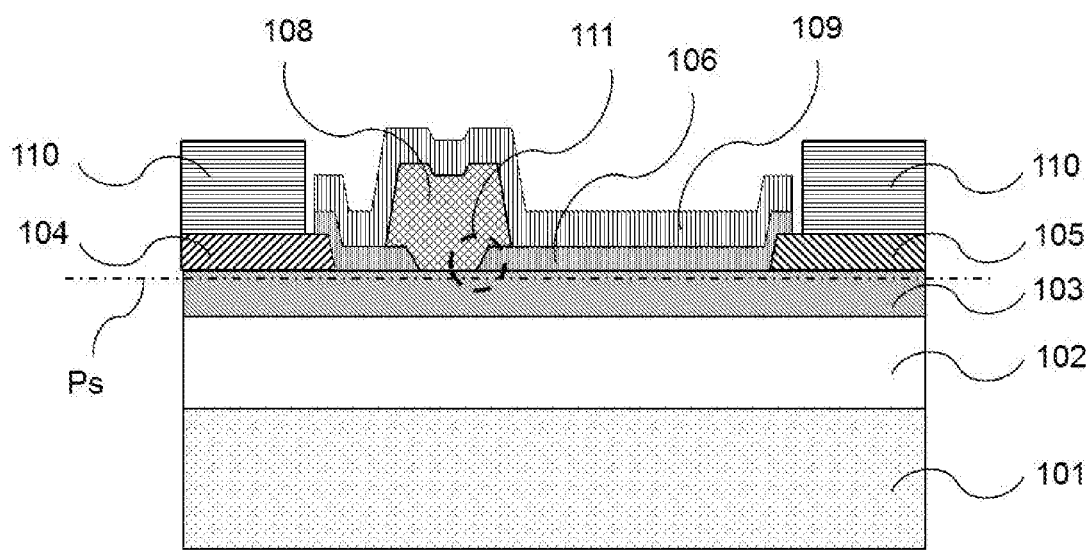
FIG. 1 is a cross-sectional view showing, by way of example, a field-effect transistor according to Embodiment 1.

In addition, upon a semiconductor surface, a gate electrode 108 having a Schottky junction therewith is formed, and, as exactly shown in FIG. 1, the gate electrode takes on, so to speak, a shape like a figure-T (pseudo T-type shape) in which the gate electrode covers the inside of a region where the insulation film 106 is opened between the source electrode 104 and the drain electrode 105, and covers partially to ride upon the insulation film.

Moreover, an opening portion of the insulation film 106 at a gate electrode portion is formed to have shapes each tilted in a tapered type as shown in a part surrounded by the broken line in FIG. 1, to be specific, to have shapes in which front-face sides at the opening portion of the insulation film are each tilted on a drain side, and on a source side. Note that, a dielectric protection film 109 for protecting an operating portion(s) in the transistor is formed so as to cover the gate electrode 108 and the insulation film 106; as for the dielectric protection film 109, an SiN film is widely used in the GaN-based HEMT.

Furthermore, wiring electrodes 110 are formed for connecting an external circuitry (not shown in the figure) in which each of the source electrode 104, the drain electrode 105, and the gate electrode 108 being drawn out by extending it outside of an operating portion(s) in the transistor is connected.

Next, the explanation will be made in detail for a manufacturing method of a field-effect transistor shown in FIG. 1 as follows. It is possible to produce the field-effect transistor of FIG. 1 in accordance with, for example, a general manufacturing method of a GaN-based HEMT as will be explained below.

First, by means of an MOCVD (Metal Organic Chemical Vapor Deposition; metal organic chemical vapor deposition) method, an AlN nucleation layer (not shown in the figure), an undoped channel layer 102 (here, a GaN channel layer), and an undoped electron supply layer 103 (here, an AlGaN electron supply layer) are layered in succession upon the SiC substrate 101. Two-dimensional electron gas is generated in a hetero interface of AlGaN/GaN, which acts as an electric current traveling layer in the semiconductor layers. In order to obtain a sheet carrier concentration Ns in a range of $2 \times 10^{12}/cm^2$ to $4 \times 10^{13}/cm^2$ which is suitable for target capability of the product(s), Al composition of the AlGaN electron supply layer described above and its film thickness are adjusted; there are many instances in which, for example, the Al composition is adjusted in a range of 10% to 30%, and the film thickness, adjusted in that of 10 nm to 40 nm. As the occasion requires, upon the AlGaN electron supply layer, an undoped GaN cap layer or an n-GaN cap layer may be further layered.

It should be noted that, as for the substrate for obtaining a GaN-based HEMT, sapphire, an Si and/or a GaN can be used; it is only necessary to grow an epitaxial layer suitable for a substrate material, so that limits therefor are not imposed in the disclosure of the application concerned.

Next, upon a semiconductor surface layer having been produced, Ti/Al/Ti/Au layered metals are formed, for example, by means of a general vapor-deposition method, by way of opening parts of a photoresist into which a patterning has been performed by means of a general photolithography process step. From that time onward, the photoresist is peeled by means of a lift-off; and thereafter, heat treatment (800° C. to 950° C.) is performed for obtaining ohmic contacts at interfaces between the semiconductor surface and the Ti/Al/Ti/Au layered metals. According to the manner described above, the source electrode 104 and the drain electrode 105 are obtained.

Subsequently, the insulation film 106 is formed to cover the semiconductor surface. In a GaN-based HEMT, an SiN film is widely used therefor. As for a forming method of the insulation film, it is formed by using a plasma CVD method, a thermal CVD method, a catalytic CVD (Cat-CVD) method, an ECR sputtering method, or the like. At this time, an SiN film, being a material of different type and being one of insulation films, is formed upon the semiconductor surface, so that residual stress is caused. The stress changes depending on a film formation method and/or a growth condition(s). The SiN film used for an experiment for this occasion is defined as a film(s) produced by a plasma CVD method or an ECR sputtering method, and so, a single-layer film or layered film(s) is formed in accordance with an object.

Subsequently, in the insulation film 106 described above, an opening portion 111 for a gate in tapered shapes is formed in order to form the gate electrode 108 by way of an opening part of a photoresist into which a patterning has been performed by means of a general photolithography process step. As for a method to form the opening portion 111, used in general is, for example, wet etching using buffered hydrofluoric acid (BHF), or dry etching by means of an RIE (Reactive Ion Etching) method, an ECR (Electron Cyclotron Resonance) method or an ICP (Inductive Coupled Plasma) method.

As a means for obtaining the opening portion 111 having tapered shapes shown in FIG. 1 which is a feature of this time, a method is taken in the disclosure of the application concerned so that, between the insulation film 106 and a photoresist, a sacrificial insulation film (SiN film), for forming the opening portion 111, having a dry etching rate higher than that of the insulation film 106 is formed by means of plasma CVD in a predetermined film thickness; and afterward, the opening portion 111 is formed by means of dry etching by the ICP method.

According to the present method, side etching from the opening part of a photoresist upon the sacrificial insulation film described above proceeds faster in time than that upon the insulation film 106 (by utilizing the difference of dry etching rates), so that it is possible to obtain tapered shapes (trapezoidal prism's oblique contour faces) in which front-face sides at the opening portion of the insulation film 106 are tilted on a drain side and on a source side to have desired angles (25 degrees to 75 degrees) depending on the film thickness of the sacrificial insulation film.

Next, in a region of the opening portion 111 described above, any one of layered metals among, for example, Ni/Au, Pt/Au and Pt/Ti/Au is selected as an effective layered metal to obtain a good Schottky junction in the GaN-based HEMT, and is formed, for example, by means of a general vapor-deposition method, by way of an opening part of a photoresist into which a patterning has been performed by means of a general photolithography process step, so that the gate electrode 108 is obtained.

Subsequently, the dielectric protection film 109 for protecting an operating portion(s) in the transistor is formed, and further, predetermined places of the dielectric protection film 109 are opened by means of a general photolithography process step. And thereafter, the wiring electrodes 110 are formed for connecting an external circuitry (not shown in the figure) in which each of the source electrode 104, the drain electrode 105, and the gate electrode 108 being drawn out by extending it outside of an operating portion(s) in the transistor is connected, so that the field-effect transistor of GaN-based HEMT in FIG. 1 can be obtained.

In order to verify the operations and effects of Embodiment 1, prototype production of AlGaN/GaN HEMT transistors was actually carried out, and the evaluation of gate leakage currents was performed.

First, as for the experiments, an SiN film having compressive stress of −2 GPa was used for the insulation film 106. A general adjustment range for the SiN film formed by means of a plasma CVD method is in a range from compressive stress of −400 MPa to tensile stress of 400 MPa.

For dealing therewith, in this time, the implementation was made therefor by using an ECR sputtering apparatus in order to obtain the insulation film 106 of compressive stress at −2 GPa. The film thickness of the insulation film 106 was set at 80 nm. However, when residual stress of an insulation film became higher, it was feared to more extent that a malfunction such as a crack(s) of the insulation film or peeling thereof might be caused. According to a sequence of verification in this time, a malfunction such as a crack(s) of the insulation film or peeling thereof had not been caused at least up to the compressive stress of −3 GPa, even at 200 nm that was presumed as approximately a maximum value as the film thickness applied to the insulation film 106. In addition, according to the production processes in this time, an inclination angle at a tapered shape portion of the opening portion indicated by numeral "111" of FIG. 1 was obtained at 60 degrees.

Here, as one problem in a GaN-based HEMT, there are exemplary cases in which a gate leakage current varies to a large extent by receiving an influence of a wet process (es) or a dry process (es) at a wafer process step, or are exemplary cases in which a gate leakage current varies to a large extent by receiving an influence of an insulation film for protecting a semiconductor epitaxial layer's surface.

Moreover, when a stress value of an insulation film is adjusted by altering a growth condition(s) of various kinds of film formation devices, and when a gate leakage current, if at all changes, it is significantly difficult under actual circumstances to distinguish if the cause is originated due to film quality, or due to the stress of the insulation film.

Figure 2:
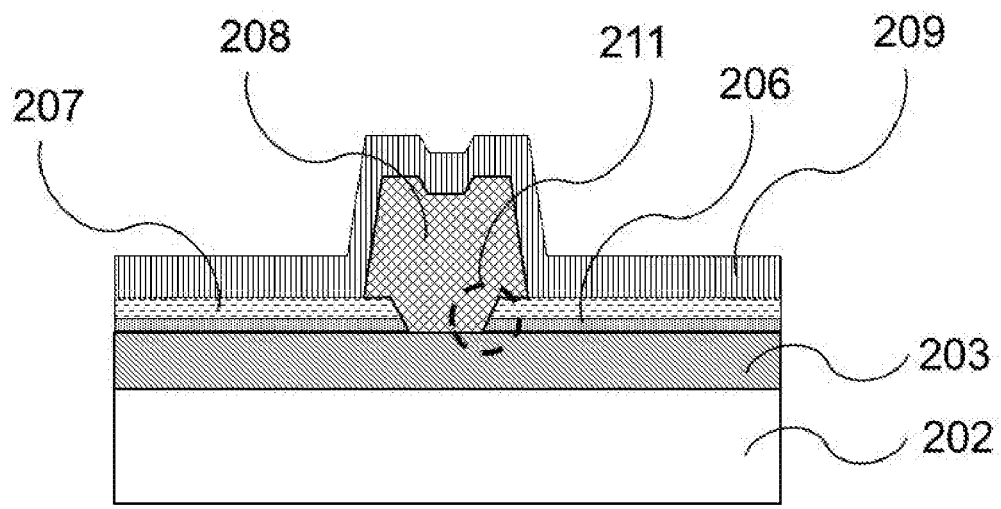
FIG. 2 is a cross-sectional view showing, by way of example, a field-effect transistor according to Embodiment 2.
Figure 3:
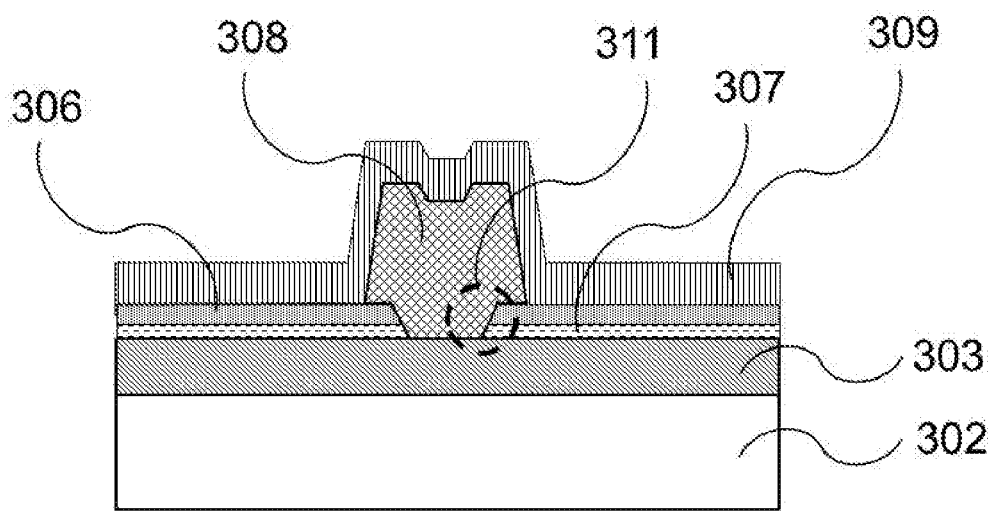
FIG. 3 is a cross-sectional view showing, by way of example, a field-effect transistor according to Embodiment 3.

For dealing therewith, in this time, it has been determined that, in order to ultimately get rid of an influence(s) due to a wafer process on to a semiconductor surface, or of an influence(s) of film quality of an insulation film, the evaluations are carried out by combining transistor structures shown in FIG. 2 and FIG. 3 in addition to the transistor structure of FIG. 1.

In the structure of a gate portion shown in FIG. 2, a first insulation film 206 having compressive stress therein is formed directly upon an electron supply layer 203 with respect to the region of the insulation film 106 of FIG. 1, and a second insulation film 207 having tensile stress therein, formed upon the first insulation film 206, so that those films are separately layered in two layers. A total thickness was made uniform in the thickness of 80 nm of FIG. 1, and thus, it was so arranged that the difference of gate leakage currents was not caused due to the film thickness.

Three field-effect transistors according to FIG. 2 were produced so that film thickness ratios each of the first insulation film 206 having compressive stress therein with respect to the second insulation film 207 having tensile stress therein took on one of 10 nm/70 nm, 20 nm/60 nm, and 30 nm/50 nm.

Note that, the second insulation film 207 having tensile stress therein was formed by means of plasma CVD, so that its stress value was obtained at 130 MPa. Here, the compressive stress of the first insulation film 206 was at −2 GPa. An inclination angle of an opening portion 211 in a tapered shape surrounded by the circular broken line in FIG. 2 is at 60 degrees.

Meanwhile, in the structure of a gate portion shown in FIG. 3, a first insulation film 307 having tensile stress therein is formed directly upon an electron supply layer 303 with respect to the region of the insulation film 106 of FIG. 1, and a second insulation film 306 having compressive stress therein, formed upon the first insulation film 307, so that those films are separately layered in two layers. A total thickness was made uniform in the thickness of 80 nm of FIG. 1, and thus, it was so arranged that the difference of gate leakage currents was not caused due to the film thickness.

Three field-effect transistors according to FIG. 3 were produced so that film thickness ratios each of the first insulation film 307 having tensile stress therein with respect to the second insulation film 306 having compressive stress therein took on one of 10 nm/70 nm, 20 nm/60 nm, and 80 nm/0 nm (in the last case, the second insulation film 306 was not formed).

It should be noted that the first insulation film 307 having tensile stress therein was formed by means of plasma CVD, so that its stress value was obtained at 130 MPa. A stress value of the second insulation film 306 having the compressive stress therein was at −2 GPa. Note that, inclination angles at an opening portion 311 in tapered shapes in FIG. 3 were each at 60 degrees.

Figure 4:
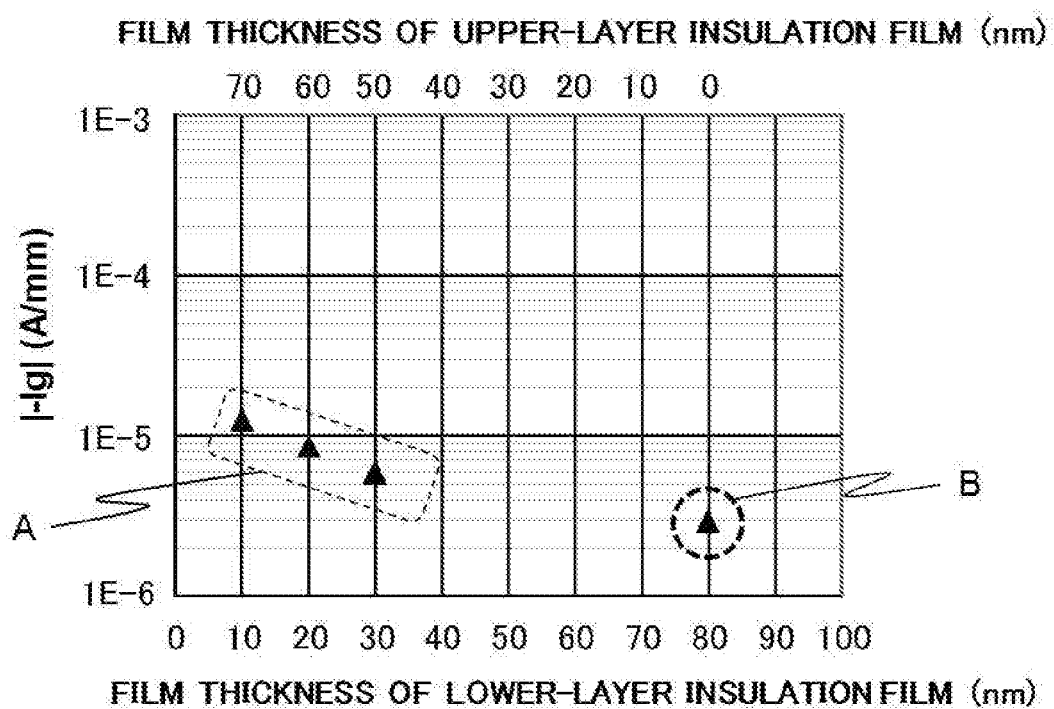
FIG. 4 is a diagram showing experimental results of gate leakage currents in cases in which field-effect transistors of FIG. 2 are used.

Measurement results of gate leakage currents are shown in FIG. 4, when film thickness ratios of the first insulation film 206 having compressive stress therein with respect to the second insulation film 207 having tensile stress therein were 10 nm/70 nm, 20 nm/60 nm, 30 nm/50 nm, and 80 nm/0 nm (in the last case, the insulation film having had tensile stress therein was not formed; refer to the structure of FIG. 1), respectively. In FIG. 4, tensile stress was caused in the upper-layer insulation film, and compressive stress, in the lower-layer insulation film. In addition, the outline of the dotted line indicated by symbol "A" in the figure was at film thickness ratios applicable to the transistor structure shown in FIG. 2, and the outline of the circular broken line indicated by symbol "B," applicable to the transistor structure shown in FIG. 1. Moreover, the solid triangular symbols indicate evaluated leakage current values when the corresponding film thickness ratios were set. As exactly shown in FIG. 4, the results had been obtained in that, the more the film thickness of the insulation film having compressive stress therein was increased (refer to the values of the lower-layer insulation film on the lower side), the smaller the gate leakage current became.

Figure 5:
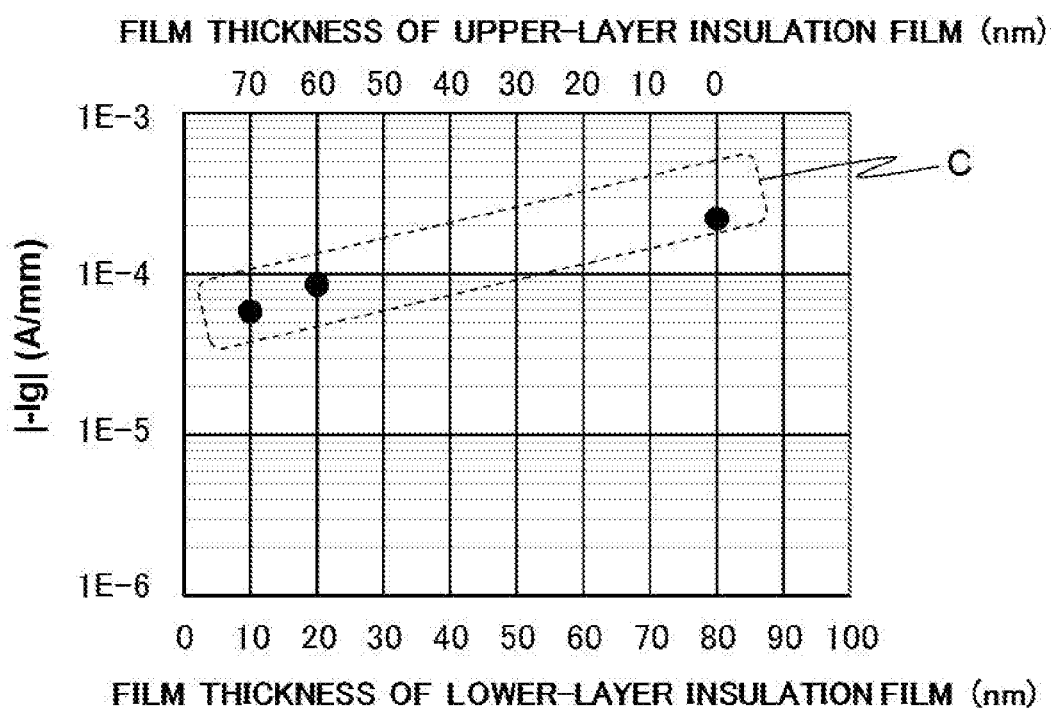
FIG. 5 is a diagram showing experimental results of gate leakage currents in cases in which field-effect transistors of FIG. 3 are used.

Next, measurement results of gate leakage currents are shown in FIG. 5, when film thickness ratios of the first insulation film 307 having tensile stress therein with respect to the second insulation film 306 having compressive stress therein were 10 nm/70 nm, 20 nm/60 nm, and 80 nm/0 nm (in the last case, the second insulation film 306 was not formed), respectively. In FIG. 5, compressive stress was caused in the upper-layer insulation film, and tensile stress, in the lower-layer insulation film. In addition, the outline of the dotted line indicated by symbol "C" in the figure was at the film thickness ratios applicable to the transistor structure shown in FIG. 3. The solid circles in the outline indicate evaluated values of gate leakage currents in each of the cases in which the three film thickness ratios described above were set.

As exactly shown in FIG. 5, the more the film thickness of the insulation film having tensile stress increased, the larger a gate leakage current became; as a result, namely, the thicker the film thickness of the insulation film having compressive stress was, the smaller the gate leakage current became.

According to the results of FIG. 4 and FIG. 5, a gate leakage current uniformly became smaller when the film thickness of the insulation film having compressive stress was increased, without depending on if it was directly formed upon a semiconductor surface, whereby it is clear that the operations had worked so as to lower the electric field intensity due to residual stress of the insulation film.

Moreover, when a field-effect transistor having a structure to take a film thickness ratio of the first insulation film 206 of FIG. 2 having compressive stress therein with respect to the second insulation film 207 thereof having tensile stress therein as 70 nm/10 nm was produced, if at all, a field-effect transistor having a structure to take a film thickness ratio of the first insulation film 307 of FIG. 3 having tensile stress therein with respect to the second insulation film 306 thereof having compressive stress therein as 10 nm/70 nm has a gate leakage current larger than that of the transistor having the film thickness ratio 70 nm/10 nm of FIG. 2, which is clear from the results of FIG. 4 and FIG. 5 described above. This is a very interesting result which strongly suggests a possibility in which a film type of an insulation film(s) directly formed upon the semiconductor surface influences.

According to the experimental results in this time, even when inclination angles at a tapered-type opening portion of an insulation film were 60 degrees, an insulation film having compressive stress was made more effective on the occasion to reduce a gate leakage current.

While on the other hand, the higher a value of tensile stress is, the smaller a gate leakage current becomes, as a result according to the simulated results of FIG. 12, when inclination angles at a tapered-type opening portion of an insulation film are at 60 degrees; and so, as absolute values, there is disconnection to the experimental results described above.

However, the device simulation gives results being calculated based on the structures of field-effect transistors having been given, and on physical property values of various kinds of material constituting of the structures, and so, because the physical property values are reviewed as parameters, the universality of the operations with respect to a gate leakage current caused due to the structure of a gate portion and residual stress of a material(s) will be understood for the qualitative tendency.

Meanwhile, experimentally, another result (not shown in the figure) has also been separately obtained in which, when inclination angles at an opening portion of an insulation film having tapered shapes are even at 75 degrees, it can be determined that an insulation film having compressive stress can make a gate leakage current smaller.

As already explained above, crystal strain of a semiconductor surface at gate's end portions changes by the operations of the combination between inclination angles at an opening portion of an insulation film and residual stress of the insulation film; and so, when predetermined conditions are satisfied, the operations can be obtained by which the electric field intensity at the gate's end portions is mitigated.

By taking into consideration of the contents explained above, it is possible to obtain a field-effect transistor whose gate leakage current can be uniformly reduced, without being influenced by a state(s) of a semiconductor surface, or by film quality of a dielectric protection film for protecting the surface.

Embodiment 2

With respect to a region of the insulation film 106 in FIG. 1 described before, an embodiment of gate structure is conceivable in which, as shown in FIG. 2, a first insulation film 206 being an insulation film having compressive stress is formed directly upon the electron supply layer 203, and the second insulation film 207 being an insulation film having tensile stress, formed upon the first insulation film 206, so that those films are separately layered in two layers. Note that, the first insulation film 206 is to be layered, for example, after a channel layer 202 made of a GaN layer and the electron supply layer 203 made of an AlGaN layer have been layered one after another.

On the occasion to design or manufacture a field-effect transistor, there are many instances in which an insulation film(s) is formed other than the first insulation film 206 and the second insulation film 207 (for example, a dielectric protection film 209 for protecting top faces of a gate electrode 208 is formed, in many cases, from a viewpoint of securing the reliability over a prolonged period of time; namely as shown in FIG. 2, the gate electrode 208 and the second insulation film 207 are each covered on their top faces by means of the dielectric protection film 209, so that they are protected). In a case or the like in which a film having tensile stress therein should be used at such a process step in order to control the stress defined by a total thickness of insulation films for protecting a transistor within a predetermined range, a case is conceivable in which an insulation film is utilized in a double film layered structure of this embodiment.

As exactly shown in the experimental results of FIG. 4, it can be understood that, also in the structure of Embodiment 2, the same operations as those of Embodiment 1 can be obtained.

As described above, by utilizing the insulation film of compressive stress, it is possible to keep the degradation of a gate leakage current at the irreducible minimum.

Embodiment 3

As already described before, an embodiment of gate structure is conceivable in which, as shown in FIG. 3, a first insulation film 307 having tensile stress is formed directly upon the electron supply layer 303 with respect to a region of the insulation film 106 in FIG. 1, and the second insulation film 306 having compressive stress, formed upon the first insulation film 307, so that those films are separately layered in two layers. Note that, in the figure, the first insulation film 307 is to be layered, for example, after a channel layer 302 made of a GaN layer and the electron supply layer 303 made of an AlGaN layer have been layered one after another. In addition, the second insulation film 306 and a gate electrode 308 are covered on their top faces by means of a dielectric protection film 309, so that they are protected.

It has already been described above that the capability of a GaN-based HEMT or its reliability is strongly dependent on a state(s) of a semiconductor surface, or on an influence(s) of film quality of an insulation film for protecting the surface. According to the constraints determined by a kind of a film(s), the film thickness, a process(s) of film formation and the like, a case is conceivable in which the insulation film having tensile stress should be rather utilized upon a semiconductor surface side.

As exactly shown in the experimental results of FIG. 5, it can be understood that, also in the structure of Embodiment 3, the same operations as those of Embodiment 1 can be obtained.

As described above, by utilizing the insulation film having compressive stress, it can be understood that the degradation of a gate leakage current can be kept at the irreducible minimum.

Embodiment 4

It has already been described above that the capability of a GaN-based HEMT or its reliability is strongly dependent on a state(s) of a semiconductor surface, or on an influence(s) of film quality of an insulation film for protecting the surface. Moreover, according to the constraints determined by a kind of a film(s), the film thickness, a process(es) of film formation and the like, a case is conceivable in which an insulation film having tensile stress should be rather utilized upon a semiconductor surface side.

Figure 6:
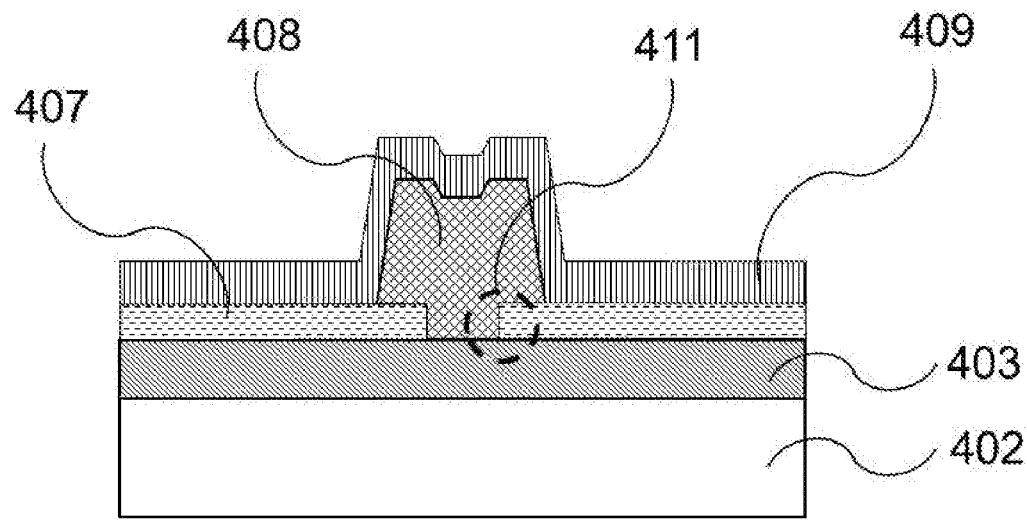
FIG. 6 is a cross-sectional view showing, by way of example, a field-effect transistor according to Embodiment 4.

In such a case, the simulated results of FIG. 12 become useful. To be specific, as shown in FIG. 6, a semiconductor surface is directly covered by means of an insulation film 407, and the insulation film 407 is an insulation film having tensile stress therein. And then, an opening portion of the insulation film 407 is formed so as to have 90 degrees with respect to an top surface of an electron supply layer 403 (in a case in which the opening portion has rectangular-parallelepipedic contour faces), or to have inclination angles of 75 degrees to 90 degrees or less viewed from the top surface of the electron supply layer 403 (in a case in which the opening portion has trapezoidal prism's oblique contour faces; refer to the opening portion 411 shown by the circular broken line in the figure). Note that, in the figure, the insulation film 407 is to be layered, for example, after a channel layer 402 made of a GaN layer and the electron supply layer 403 made of an AlGaN layer have been layered one after another. In addition, the insulation film 407 and a gate electrode 408 are each covered on their top faces by means of a dielectric protection film 409, so that they are protected.

According to the simulated results of FIG. 10 and FIG. 11, a transistor produced according to Embodiment 4 can obtain the operations in which the electric field intensity at gate's end portions is more mitigated than a transistor formed for the insulation film 407, if at all, by an insulation film having compressive stress therein.

Moreover, according to the simulated results of FIG. 12, it is possible to obtain a field-effect transistor (to be specific, refer to a case in which an angular parameter is at 75 degrees in FIG. 12) whose gate leakage current can be uniformly reduced, without being dependent on a state(s) of a semiconductor surface, or on film quality of a dielectric protection film for protecting the surface.

In the disclosure of the application concerned, various exemplary embodiments and experimental examples are described; however, various features, aspects and functions described in one or a plurality of embodiments are not necessarily limited to the applications of a specific embodiment(s), but are applicable in an embodiment(s) solely or in various combinations.

Therefore, limitless modification examples not being exemplified can be presumed without departing from the scope of the technologies disclosed in Description of the disclosure of the application concerned. For example, there arise cases which are included as a case in which at least one constituent element is modified, added or eliminated, and further a case in which at least one constituent element is extracted and then combined with a constituent element(s) of another embodiment.

EXPLANATION OF NUMERALS AND SYMBOLS

Numeral "101" designates a semiconductor substrate; "102," "202," "302," "402," channel layer; "103," "203," "303," "403," electron supply layer; "104," source electrode; "105," drain electrode; "106," insulation film; "108," "208," "308," "408," gate electrode; "109," "209," "309," "409," dielectric protection film; "110," wiring electrode; "111," "211," "311," "411," opening portion; "206," "307," first insulation film; "207," "306," second insulation film; and "407," insulation film (having tensile stress).

What is claimed is:

1. A field-effect transistor having a gate electrode formed on a surface of an electron supply layer, a source electrode thereon and a drain electrode thereon, the field-effect transistor comprising:
   an insulation film including a first insulation film having compressive stress therein and formed on a surface of the electron supply layer, and a second insulation film having tensile stress and formed on top faces of the first insulation film, the insulation film covering the electron supply layer, and the compressive stress of the first insulation film and the tensile stress of the second insulation film being configured such that a residual stress of the insulation film is compressive to reduce an electric field intensity at an opening end portion of the gate electrode; and
   an opening portion of the insulation film having trapezoidal prism's oblique contour faces and formed in a region to form the gate electrode in the insulation film, which makes contacts on surfaces each thereof with the electron supply layer, wherein
   the gate electrode is made to have a Schottky junction with the electron supply layer in a region where the electron supply layer is exposed through the opening portion;
   the insulation film has contacts with the gate electrode on trapezoidal prism's oblique contour faces each at the opening portion and on top faces thereat opposing to a surface where the insulation film has contacts with the electron supply layer; and
   cross-sectional shapes of trapezoidal prism's oblique contour faces each at the opening portion are made to have inclination angles set in a range from twenty-five degrees to seventy-five degrees with respect to a surface of the electron supply layer.

2. The field-effect transistor as set forth in claim 1, wherein the compressive stress of the first insulation film is set in a range from minus three gigapascals (−3 GPa) to minus zero point five gigapascal (−0.5 GPa).

3. The field-effect transistor as set forth in claim 2, wherein the insulation film is a silicon nitride film.

4. The field-effect transistor as set forth in claim 2, wherein the electron supply layer is formed on a channel layer formed on a semiconductor substrate made of silicon carbide (SiC), gallium nitride (GaN) or sapphire.

5. The field-effect transistor as set forth in claim 2, wherein the field-effect transistor includes a GaN-based high-electron-mobility transistor.

6. The field-effect transistor as set forth in claim 5, wherein the GaN-based high-electron-mobility transistor is an AlGaN/GaN high-electron-mobility transistor.

7. The field-effect transistor as set forth in claim 1, wherein the insulation film is a silicon nitride film.

8. The field-effect transistor as set forth in claim 7, wherein the electron supply layer is formed on a channel layer formed on a semiconductor substrate made of silicon carbide (SiC), gallium nitride (GaN) or sapphire.

9. The field-effect transistor as set forth in claim 7, wherein the field-effect transistor includes a GaN-based high-electron-mobility transistor.

10. The field-effect transistor as set forth in claim 9, wherein the GaN-based high-electron-mobility transistor is an AlGaN/GaN high-electron-mobility transistor.

11. The field-effect transistor as set forth in claim 1, wherein the electron supply layer is formed on a channel layer formed on a semiconductor substrate made of silicon carbide (SiC), gallium nitride (GaN) or sapphire.

12. The field-effect transistor as set forth in claim 11, wherein the field-effect transistor includes a GaN-based high-electron-mobility transistor.

13. The field-effect transistor as set forth in claim 12, wherein the GaN-based high-electron-mobility transistor is an AlGaN/GaN high-electron-mobility transistor.

14. The field-effect transistor as set forth in claim 1, wherein the field-effect transistor includes a GaN-based high-electron-mobility transistor.

15. The field-effect transistor as set forth in claim 14, wherein the GaN-based high-electron-mobility transistor is an AlGaN/GaN high-electron-mobility transistor.

16. The field-effect transistor as set forth in claim 1, wherein the residual stress of the insulation film reduces a gate leakage current of the field-effect transistor.

* * * * *